(12) United States Patent
Behringer et al.

(10) Patent No.: US 9,763,330 B2
(45) Date of Patent: Sep. 12, 2017

(54) CIRCUIT BOARD, OPTOELECTRONIC COMPONENT AND ARRANGEMENT OF OPTOELECTRONIC COMPONENTS

(71) Applicant: OSRAM GmbH, Munich (DE)

(72) Inventors: Martin Rudolf Behringer, Regensburg (DE); Stefan Groetsch, Bad Abbach (DE)

(73) Assignee: OSRAM GmbH (DE)

( * ) Notice: Subject to any disclaimer, the term of this patent is extended or adjusted under 35 U.S.C. 154(b) by 202 days.

(21) Appl. No.: 14/165,996

(22) Filed: Jan. 28, 2014

(65) Prior Publication Data

US 2014/0211436 A1    Jul. 31, 2014

(30) Foreign Application Priority Data

Jan. 28, 2013  (DE) ......................... 10 2013 201 327

(51) Int. Cl.
   *H02G 3/00*     (2006.01)
   *H05K 1/18*     (2006.01)
   *H01L 33/62*    (2010.01)

(52) U.S. Cl.
   CPC ............. *H05K 1/183* (2013.01); *H05K 1/184* (2013.01); *H01L 33/62* (2013.01);
   (Continued)

(58) Field of Classification Search
   CPC . H01L 2924/01079; H01L 2924/01078; H01L 2224/16; H02G 3/04; H02G 3/00;
   (Continued)

(56) References Cited

U.S. PATENT DOCUMENTS 5,394,490 A * 2/1995 Kato ................. G02B 6/13
                                                257/432
7,332,802 B2   2/2008 Konno
                 (Continued)

FOREIGN PATENT DOCUMENTS

| CN | 102027596 | 4/2011 |
| DE | 10 2010 050 342 A1 | 5/2012 |
| WO | 2009/132615 A1 | 11/2009 |

OTHER PUBLICATIONS

Notification of the First Office Action dated Apr. 19, 2017, of corresponding Chinese Application No. 20140041542.2 in English.

*Primary Examiner* — Pete Lee
(74) *Attorney, Agent, or Firm* — DLA Piper LLP (US)

(57) ABSTRACT

A circuit board for an optoelectronic semiconductor chip includes an electrically conductive first metal foil, a first electrically insulating foil, an electrically conductive second metal foil, wherein the first electrically insulating foil is applied to the first metal foil at a top side of the first metal foil and mechanically connects thereto, the first electrically insulating foil has a recess in which the first metal foil is exposed, the recess electrically conductively fixes the optoelectronic semiconductor chip to the first metal foil within the recess, the second metal foil is applied at a top side of the first electrically insulating foil, the top side facing away from the first metal foil, and mechanically connects to the electrically insulating foil, the first electrically insulating foil is free of the second metal foil at least in the region of the recess, and the second metal foil electrically contacts the optoelectronic semiconductor chip.

19 Claims, 7 Drawing Sheets

(52) U.S. Cl.
CPC ............... *H01L 2224/48091* (2013.01); *H01L 2224/48465* (2013.01); *H05K 2201/10636* (2013.01); *H05K 2203/049* (2013.01); *Y02P 70/611* (2015.11)

(58) Field of Classification Search
CPC .......... H01B 5/102; H01B 5/107; H01B 5/00; H01B 5/104; H01B 5/12; H01B 12/00; H01B 12/02; H01B 12/04; H01B 12/06; H01B 12/08; H01B 12/10; H01B 12/12; H01B 12/14; H01B 12/16; H01B 3/47; H01B 3/48; H01B 3/485; H01B 3/50; H01B 3/52; H01B 3/54; H01B 3/545; D06M 11/77; D06M 11/78; D06M 11/79; D06M 15/647; D06M 15/65; D06M 15/651; D06M 15/652; D06M 15/653; D06M 15/657; D06M 2200/10; D06M 2200/11; D06M 2203/066; D06M 2209/125; D06M 2209/128; D06M 2209/1692; D06M 3/128; Y10T 442/223
USPC ..... 174/260–265; 257/99, 784, 686, 690, 98
See application file for complete search history.

(56) References Cited

U.S. PATENT DOCUMENTS

| | | | |
|---|---|---|---|
| 2004/0227146 A1* | 11/2004 | Wu ................................. | 257/99 |
| 2009/0032295 A1* | 2/2009 | Okajima ................ | H05K 1/028 174/260 |
| 2009/0065792 A1* | 3/2009 | Thompson .............. | H01L 33/54 257/98 |
| 2009/0267093 A1* | 10/2009 | Kamada ................ | H01L 33/483 257/98 |
| 2011/0062464 A1 | 3/2011 | Gerhard | |

* cited by examiner

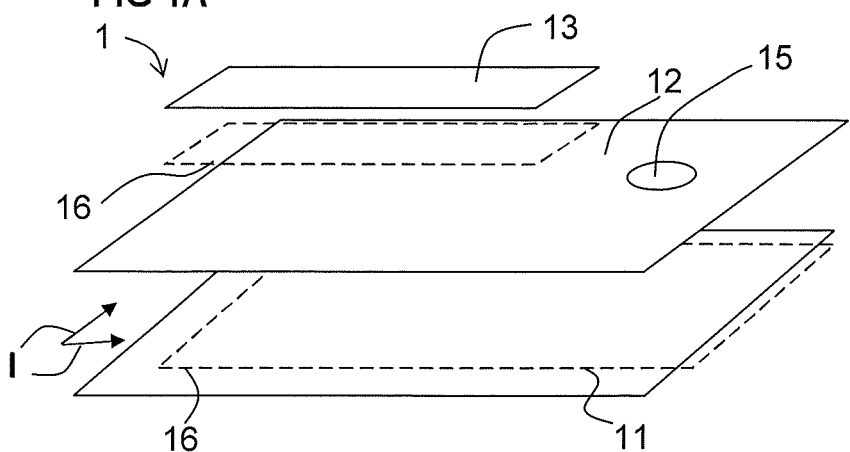
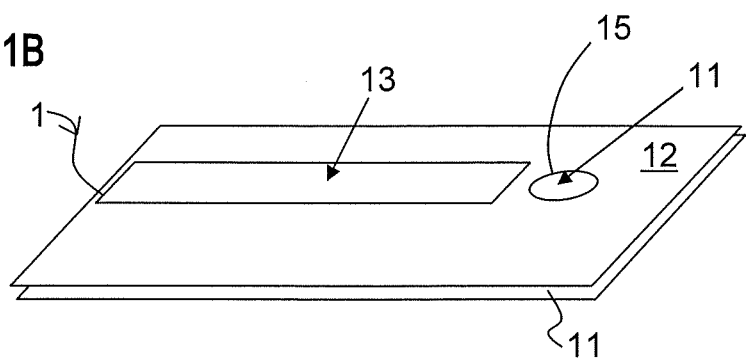
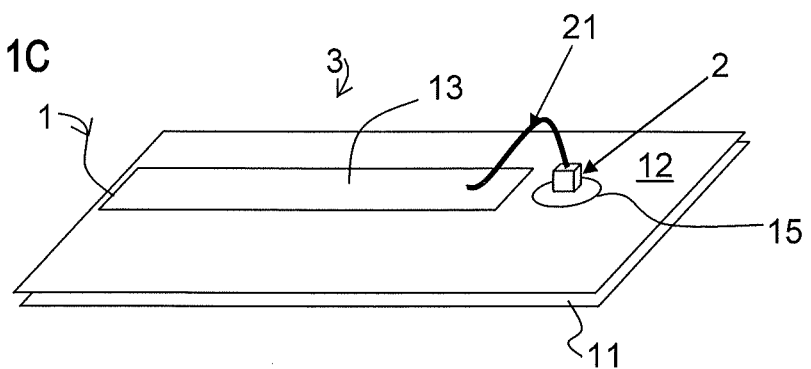

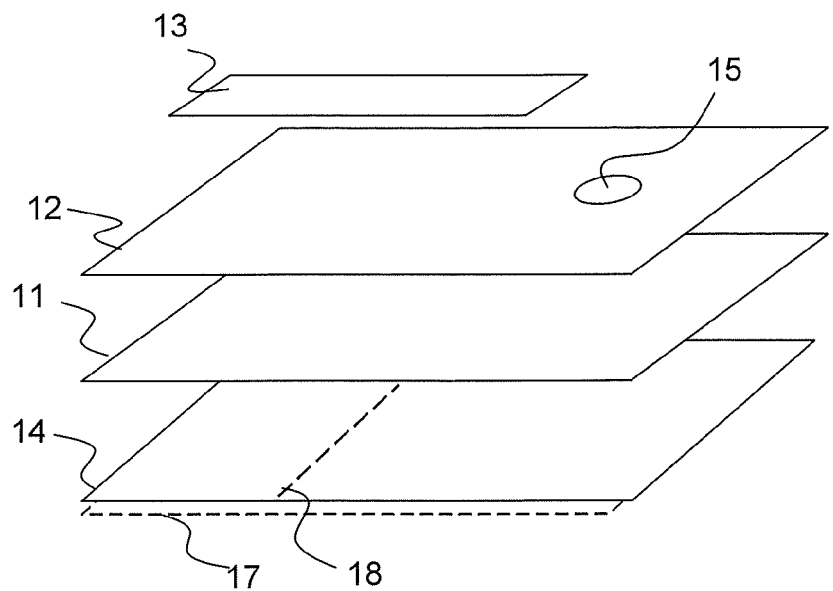
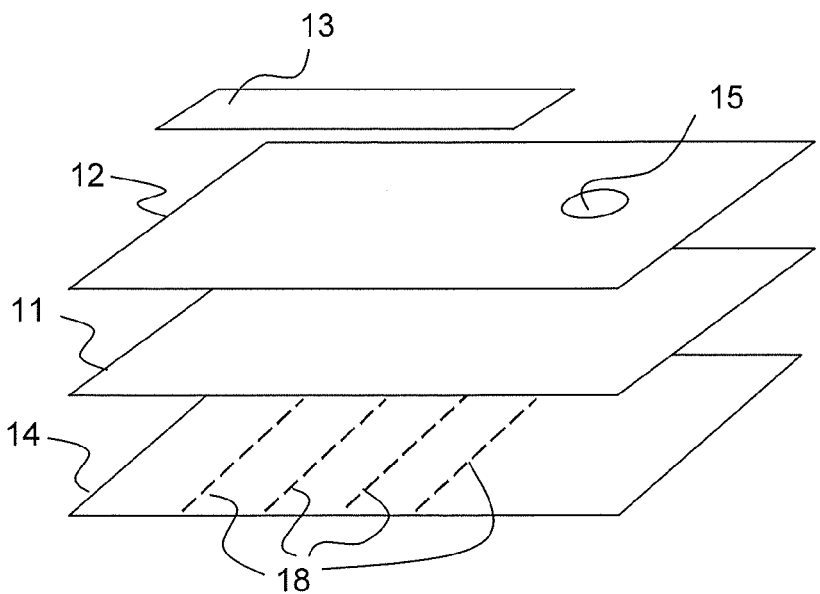

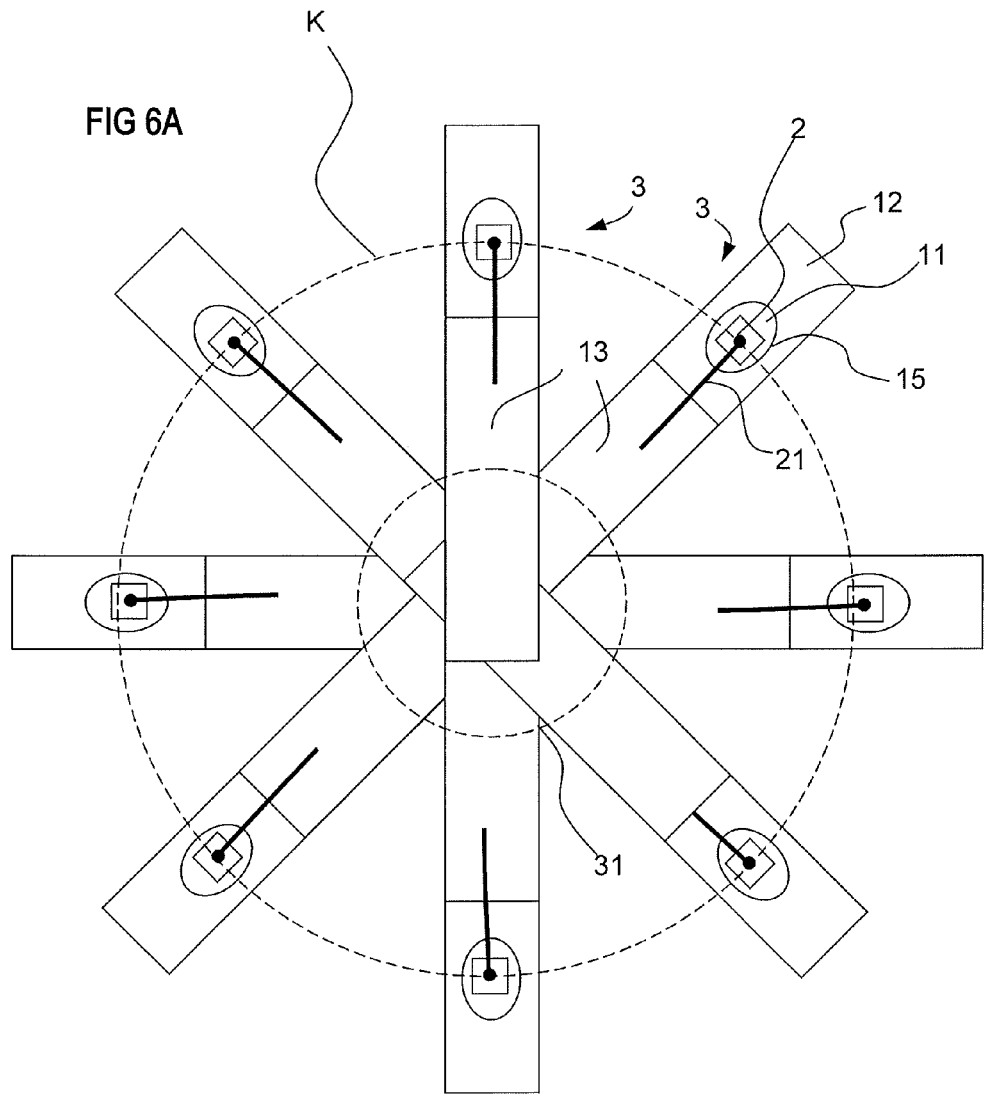

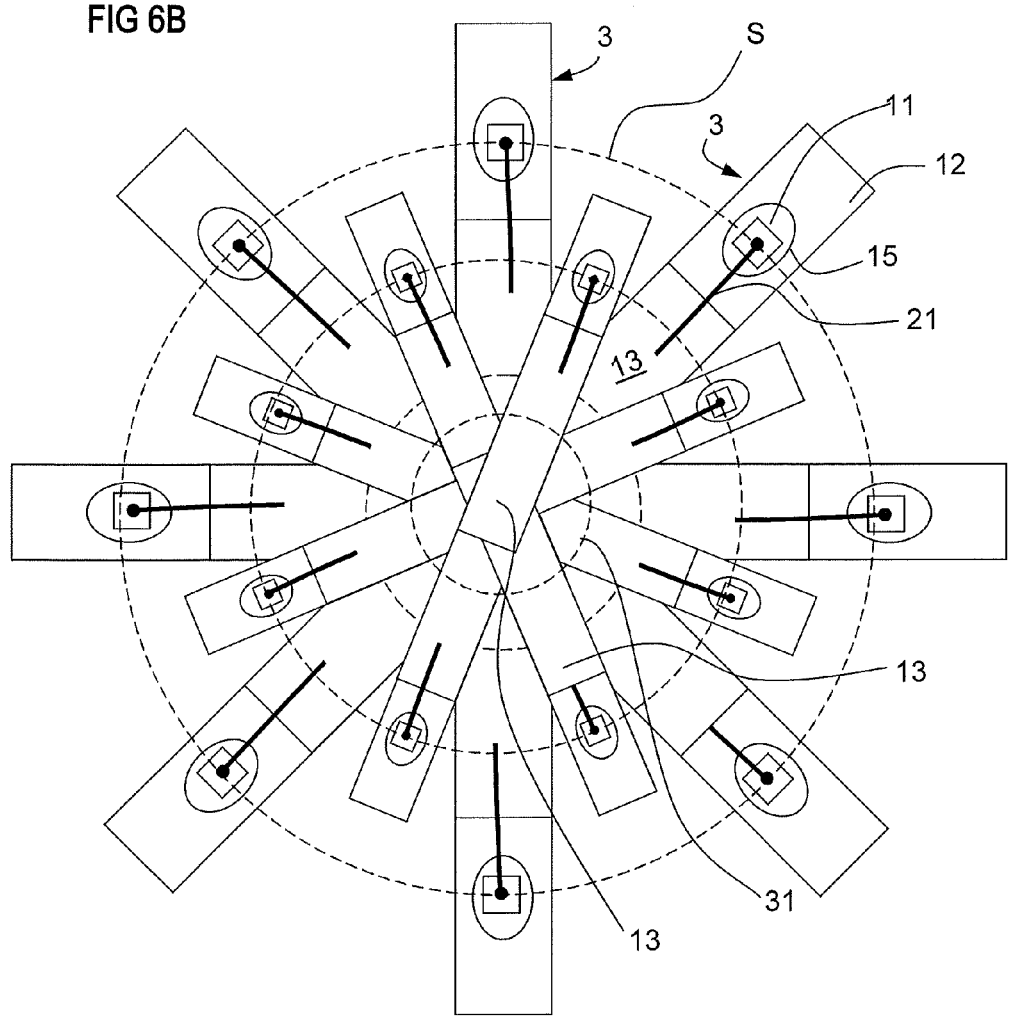

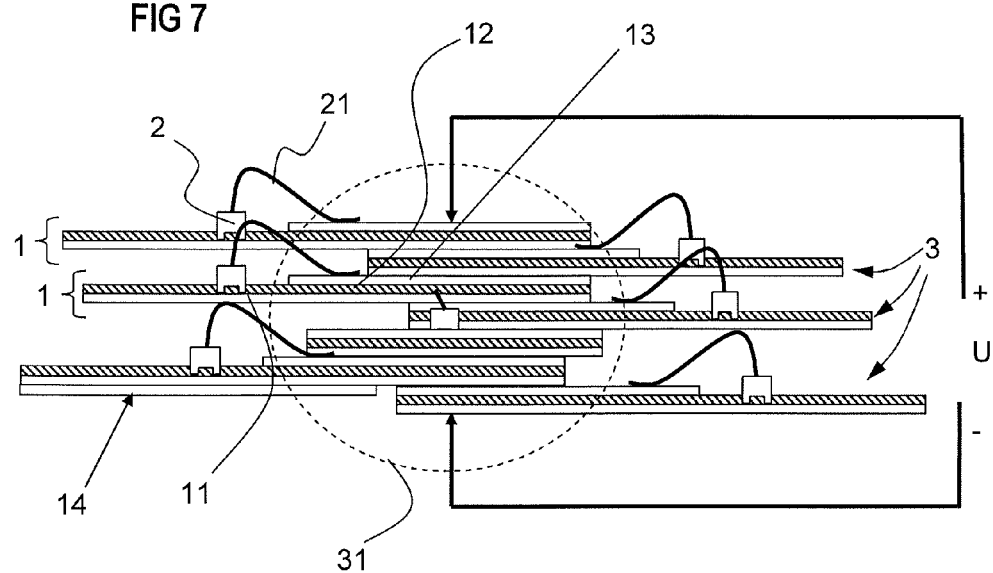

CIRCUIT BOARD, OPTOELECTRONIC COMPONENT AND ARRANGEMENT OF OPTOELECTRONIC COMPONENTS

TECHNICAL FIELD

This disclosure relates to a circuit board, an optoelectronic component comprising such a circuit board is specified and an arrangement of the optoelectronic components.

BACKGROUND

WO 2009/132615 describes a circuit board. There is nonetheless a need for a circuit board which can be produced particularly cost-effectively as well as optoelectronic components and arrangements of optoelectronic components comprising such a circuit board.

SUMMARY

We provide a circuit board for an optoelectronic semiconductor chip including an electrically conductive first metal foil, a first electrically insulating foil, an electrically conductive second metal foil, wherein the first electrically insulating foil is applied to the first metal foil at a top side of the first metal foil and mechanically connects thereto, the first electrically insulating foil has a recess in which the first metal foil is exposed, the recess electrically conductively fixes the optoelectronic semiconductor chip to the first metal foil within the recess, the second metal foil is applied at a top side of the first electrically insulating foil, the top side facing away from the first metal foil, and mechanically connects to the electrically insulating foil, the first electrically insulating foil is free of the second metal foil at least in the region of the recess, and the second metal foil electrically contacts the optoelectronic semiconductor chip.

We also provide an optoelectronic component including the circuit board, and an optoelectronic semiconductor chip, wherein the optoelectronic semiconductor chip is electrically conductively fixed to the first metal foil within the recess, and the optoelectronic semiconductor chip electrically conductively connects to the second metal foil.

We further provide an arrangement of optoelectronic components including at least two optoelectronic components, wherein a second of the optoelectronic components is arranged on a first of the optoelectronic components such that the first metal foil of the second optoelectronic component covers the second metal foil of the first optoelectronic component in places and the two metal foils electrically conductively and mechanically connect to one another, and the first and second optoelectronic components electrically connect in series.

BRIEF DESCRIPTION OF THE DRAWINGS

FIGS. 1A to 1D, 2A to 2C, 3A to 3C, 4 and 5 show schematic views of circuit boards and optoelectronic components described here.

FIGS. 6A and 6B show schematic views of arrangements described here.

FIG. 7 shows an interconnection of optoelectronic components to form an arrangement.

DETAILED DESCRIPTION

Figure 1D:
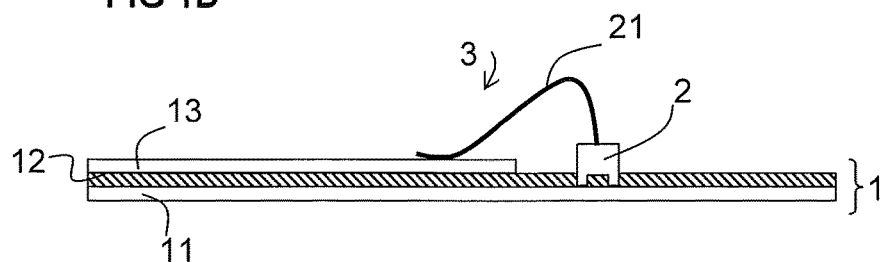

The circuit board may be suitable to receive an optoelectronic semiconductor chip. That is to say that the circuit board is a circuit board for an optoelectronic semiconductor chip. The optoelectronic semiconductor chip is a radiation-emitting or a radiation-receiving semiconductor chip. In particular, a light-emitting diode chip or a photodetector chip can be involved. In this case, the circuit board is designed with regard to its form and size such that an optoelectronic semiconductor chip can be mechanically carried by the circuit board and electrical contact can be made with the optoelectronic semiconductor chip via the circuit board.

The circuit board may comprise a first metal foil, which is electrically conductive. The metal foil is a very thin metal sheet. The metal foil is a separately produced component of the circuit board which can be provided as an independent element of the circuit board for production of the circuit board. The metal foil is, therefore, in particular not a layer in the case of which material is applied to a different component of the circuit board to produce the layer therewith, rather the metal foil already exists before production of the circuit board separately from further components of the circuit board. This applies to the first metal foil and to all further foils described here. A foil herein is a very thin sheet, the lateral dimensions of which, that is to say the dimensions in directions parallel to the main extension plane of the foil, are significantly greater than its vertical dimension, that is to say its thickness. Foils described here are pliable and flexible.

The first metal foil consists, for example, of a metal or a metal alloy and the first metal foil is electrically conductive.

The circuit board may comprise a first electrically insulating foil. The first electrically insulating foil, too, is not a layer in the case of which, for producing it, first material is applied to a different component of the circuit board, rather the first electrically insulating foil already exists as a separate component before production of the circuit board.

The circuit board may comprise a second metal foil which is electrically conductive. By way of example, the second metal foil can be designed identically to the first metal foil with regard to its thickness and/or its material composition.

The first electrically insulating foil may be applied to the first metal foil at a top side of the first metal foil and mechanically connects thereto. In this case, the first electrically insulating foil can be in direct contact with the first metal foil. Furthermore, it is possible for a connecting material to be arranged between the first electrically insulating foil and the metal foil.

The first electrically insulating foil may comprise a recess in which the first metal foil is exposed. That is to say that the first metal foil is free of the first electrically insulating foil at its top side in places, to be precise in the region of a recess of the first electrically insulating foil. The first metal foil is freely accessible through the recess.

The recess may be provided to electrically conductively fix the optoelectronic semiconductor chip to the first metal foil within the recess. That is to say that the recess is chosen with regard to its form and size such that within the recess an optoelectronic semiconductor chip can be applied to the first metal foil without, for example, contacting the first electrically insulating foil. In this case, the recess is chosen such that the optoelectronic semiconductor chip can be, for example, conductively adhesively bonded or soldered onto the first metal foil in the region of the recess.

The second metal foil may be applied at a top side of the electrically insulating foil, the top side facing away from the first metal foil and mechanically connected to the electrically insulating foil. In this case, the second metal foil and the first electrically insulating foil can be in direct contact with one another and/or there is a connecting means arranged between the two foils. The first metal foil, the first electrically insulating foil and the second metal foil thus form a stack of foils arranged one above another in places.

The first electrically insulating foil may be free of the second metal foil at least in the region of the recess. That is to say that the first electrically insulating foil is not completely covered by the second metal foil, rather, it is not covered by the second metal foil at least where the first electrically insulating foil has the recess to receive the optoelectronic semiconductor chip. The second metal foil thus does not cover the recess, in particular.

The second metal foil is provided to electrically contact the optoelectronic semiconductor chip. That is to say that with regard to its electrical conductivity and its arrangement in the circuit board the second metal foil is designed to electrically contact the optoelectronic semiconductor chip. By way of example, it is possible for the optoelectronic semiconductor chip to be electrically conductively connected in each case to the first metal foil and the second metal foil such that the optoelectronic semiconductor chip can be operated by energization via the first and second metal foils.

The circuit board may comprise a first metal foil which is electrically conductive, a first electrically insulating foil, and a second metal foil which is electrically conductive. In this case, the first electrically insulating foil is applied to the first metal foil at a top side of the first metal foil and mechanically connects thereto. The first electrically insulating foil has a recess in which the first metal foil is exposed, wherein the recess is provided to electrically conductively fix the optoelectronic semiconductor chip to the first metal foil within the recess. The second metal foil is applied at a top side of the first electrically insulating foil, the top side facing away from the first metal foil, and mechanically connects to the electrically insulating foil, the first electrically insulating foil is free of the second metal foil at least in the region of the recess, and the second metal foil is provided to electrically contact the optoelectronic semiconductor chip.

In this case, a circuit board described here is based on the following considerations, inter alia. It is possible for optoelectronic semiconductor chips such as light-emitting diode chips, for example, to be adhesively bonded or soldered on circuit boards to realize planar light sources. The circuit board material used in this case is relatively expensive. Instead of such a circuit board, a circuit board described here is a layer stack of metal foils and electrically insulating foils, which layer stack can be produced particularly cost-effectively. Furthermore, the circuit board described here is distinguished by its small thickness, which makes it possible to stack many of the circuit boards one above another to produce a planar light source, without the light source becoming too thick.

The first metal foil and the second metal foil may connect to the electrically insulating foil by an adhesive. That is to say that the layer stack of foils can be, in particular a laminated layer stack in which the individual foils are in each case connected to one another by an adhesive. In this case, the adhesive can bring the metal foils together with the electrically insulating foil in direct contact with one another in places.

The first electrically insulating foil, apart from the recess, may completely cover the first metal foil at its top side, wherein the recess is completely surrounded by material of the first electrically insulating foil in lateral directions. By virtue of the first metal foil being completely covered by the first electrically insulating foil, the circuit board can be mechanically stable. The first recess is, for example, a perforation or hole in the first electrically insulating foil, wherein the perforation or the hole is surrounded all around by the material of the first electrically insulating foil in lateral directions. This increases the mechanical stability of the circuit board including in the region of the recess, in which an optoelectronic semiconductor chip can be arranged later.

The first metal foil and the second metal foil may be formed by an aluminum foil. That is to say that the two metal foils contain or consist of aluminum. In this case, the metal foils can have in each case a thickness, that is to say an extent in the vertical direction perpendicular to the lateral directions, of at least 20 μm and at most 500 μm, in particular of at least 20 μm and at most 400 μm. In this case, the thickness of the first metal foil and of the second metal foil is preferably at least 75 μm to at most 200 μm, for example, 100 μm.

The first electrically insulating foil can be made thinner than the metal foils. By way of example, the electrically insulating foil can be made thinner than one of the metal foils by 25%. If the metal foils each have a thickness of 100 μm, for example, then the first electrically insulating foil can have a thickness of 75 μm. Such a thin first electrically insulating foil proves particularly advantageous on account of the low thermal resistance associated therewith.

For the case where the first electrically insulating foil is intended to be made thicker for the purpose of improved mechanical stabilization of the circuit board, the first electrically insulating foil comprises a matrix material filled with fibers or particles of a material having good thermal conductivity. By way of example, the first electrically insulating foil can then be formed with ceramic materials, metal oxides, metal nitrides and/or silicon which, for example, are introduced into a matrix material composed of silicone or epoxy resin.

The circuit board may comprise a second electrically insulating foil applied to the first metal foil at an underside of the first metal foil, the underside facing away from the first electrically insulating foil and mechanically conductively connects to the first metal foil. In this case, the second electrically insulating foil can be identical to the first electrically insulating foil. The second electrically insulating foil, the first metal foil, the second electrically insulating foil and the second metal foil form a stack of foils, and the foils overlap at least in places.

In this case, it is possible in particular for the first metal foil to be free of the second electrically insulating foil in places at its underside facing the second electrically insulating foil. Via these free places, it is then possible, for example, to make electrical contact with the first metal foil.

The second electrically insulating foil may have an adhesive layer at its underside facing away from the first metal foil. The adhesive layer can be provided, for example, to fix the circuit board at an intended location.

Furthermore, we provide an optoelectronic component. The optoelectronic component can be, for example, a light-emitting diode or a photodetector. The optoelectronic component comprises a circuit board described here as a carrier for an optoelectronic semiconductor chip. That is to say that all features disclosed for the circuit board are also disclosed for the optoelectronic component.

The optoelectronic component may comprise a circuit board described here and an optoelectronic semiconductor chip. In this case, the optoelectronic semiconductor chip is electrically conductively fixed to the first metal foil within the recess and the optoelectronic semiconductor chip electrically conductively connects to the second metal foil. In this case, it is possible for the optoelectronic component to comprise a multiplicity of optoelectronic semiconductor chips. The circuit board can then have, for example, exactly one recess for each optoelectronic semiconductor chip in which recess the optoelectronic semiconductor chip is electrically conductively fixed. In this case, it is furthermore possible for the circuit board to comprise a multiplicity of second metal foils where each optoelectronic semiconductor chip then electrically conductively connects to a second metal foil assigned thereto one-to-one.

The optoelectronic semiconductor chip may electrically conductively connect to the second metal foil by a contact element, for example, a contact wire, also called: bonding wire, which is fixed to the optoelectronic semiconductor chip and to the second metal foil. That is to say that a connection between the optoelectronic semiconductor chip and the second metal foil can be effected, in particular, by wire bonding. As an alternative to a contact wire, alternative connection techniques such as, for example, a foil contact-making method can also be used. Furthermore, instead of wire, it is also possible to use a ribbon composed, in particular, of a metal.

The optoelectronic semiconductor chip may be surrounded by a potting body. In this case, the potting body is in direct contact with the first metal foil and the first electrically insulating foil. That is to say that the potting body is arranged in the region of the optoelectronic semiconductor chip such that it completely covers the recess in the first electrically insulating foil and can therefore be in direct contact with both the first electrically insulating foil and the first metal foil. In this case, direct contact with the first electrically insulating foil is not absolutely necessary.

The potting body is formed, for example, with a radiation-transmissive plastic material such as silicone and/or epoxy resin. The potting body can be filled with radiation-scattering or radiation-converting particles. The potting body can be applied dropwise, for example, to the optoelectronic semiconductor chip. The potting body can cover the optoelectronic semiconductor chip and, for example, a contact wire which electrically conductively connects the optoelectronic semiconductor chip to the second metal foil. The optoelectronic semiconductor chip and the contact wire are mechanically protected by the potting body in this way. The potting body can comprise a matrix material, for example, into which radiation-scattering or radiation-converting particles are introduced. The first electrically insulating foil can be formed with the same material as the matrix material, for example, silicone, as a result of which a particularly good adhesion between the potting body and the circuit board is achieved by the direct contact between potting body and first electrically insulating foil.

It is furthermore possible for the potting body also to directly contact the second metal foil in places.

Furthermore, we provide an arrangement of optoelectronic components. The arrangement comprises at least two of the optoelectronic components described here such that all features disclosed for the circuit board and the optoelectronic components are also disclosed for the arrangement of optoelectronic components.

The arrangement of optoelectronic components comprises at least two optoelectronic components described here. By way of example, the optoelectronic components can be of identical type. That is to say that the optoelectronic components can be identical in terms of their external dimensions and/or the optoelectronic semiconductor chips used. Furthermore, it is possible, for example, for different optoelectronic semiconductor chips to be used in different optoelectronic components of the arrangement, the optoelectronic semiconductor chips emitting light of different colors during operation.

The arrangement may comprise at least two optoelectronic components, wherein a second of the optoelectronic components is arranged on a first of the optoelectronic components such that the first metal foil of the second optoelectronic component covers the second metal foil of the first optoelectronic component in places and the two metal foils electrically conductively and mechanically connect to one another, wherein the first and second optoelectronic components electrically connect in series.

That is to say that by being placed one above another and electrically conductively connected in places, for example, by soldering or adhesive bonding, the two optoelectronic components connect in series. Electrical contact can then be made with this series connection via the first metal foil of the second optoelectronic component and the second metal foil of the first optoelectronic component.

Three or more of the optoelectronic components may be arranged one above another, wherein the optoelectronic components electrically connect in series in each case via an electrically conductive and mechanical connection of the first metal foil of one of the optoelectronic components to the second metal foil of the directly underlying optoelectronic component. That is to say that the optoelectronic components are placed one above another such that the first and second metal foils of directly successive optoelectronic components can electrically conductively and mechanically connect to one another. In this way, a series connection of a plurality of optoelectronic components can be realized in a very simple manner.

In this case, it is also possible that no connecting material is arranged between the individual optoelectronic components rather that the optoelectronic components are held together by pressure in the region in which they overlap one another such that the first and second metal foils of directly successive optoelectronic components are in direct contact with one another. The pressing-together can then be effected, for example, by an outer clip or by a stamping connection or screw connection extending through all the circuit boards of the optoelectronic components.

All optoelectronic components of the arrangement overlap one another within a connection region and the optoelectronic semiconductor chips of the optoelectronic components do not overlap. This can be achieved, for example, by the optoelectronic components being arranged in a fan-like or star-shaped fashion.

The optoelectronic semiconductor chips of the optoelectronic components of the arrangement may be arranged along at least one imaginary circle or an imaginary spiral. That is to say the optoelectronic semiconductor chips can be arranged along an imaginary closed line, for example. In this way, for example, large areas can be covered with a multiplicity of optoelectronic semiconductor chips, whereby a planar light source of series-interconnected semiconductor chips can be produced in a simple manner.

The circuit board described here, the optoelectronic component described here and the arrangement described here are explained in greater detail below on the basis of examples and the associated figures.

Elements that are identical, of identical type or act identically are provided with the same reference signs in the figures. The figures and the size relationships of the elements illustrated in the figures among one another should not be regarded as to scale. However, individual elements may be illustrated with an exaggerated size to enable better illustration and/or to afford a better understanding.

A circuit board described here is described in greater detail with reference to the schematic perspective illustrations in FIGS. 1A and 1B. The circuit board 1 comprises a first metal foil 11, a first electrically insulating foil 12, a second metal foil 13. The individual foils mechanically connect to one another with an adhesive 16, for example. The first and second metal foils can be identical with regard to their thickness and their material composition. By way of example, the first metal foil 11 and the second metal foil 13 are in each case an aluminum foil having a thickness of approximately 100 µm.

The first electrically insulating foil 12 is a plastic foil which electrically insulates the two metal foils 11, 13 from one another. Furthermore, the first electrically insulating foil 12 serves to mechanically stabilize the circuit board 1.

The first electrically insulating foil 12 has a recess 15 in which the first metal foil 11 is freely accessible. The second metal foil 13 has smaller dimensions that the first metal foil 11 in the lateral directions 1. Alternatively, the second metal foil 13 can also have recesses 15 like the first electrically insulating foil 12. The first electrically insulating foil 12 completely covers the first metal foil 11 at its top side, apart from the recess 15. The first electrically insulating foil 12 has a thickness of 75 µm, for example.

As is evident from FIG. 1B, the individual foils 11, 12, 13 connect to one another by lamination, for example.

In a next step, FIG. 1C, an optoelectronic semiconductor chip 2, for example, a light-emitting diode chip, can be mechanically fixedly and electrically conductively mounted onto the first metal foil 11 within the recess of the electrically insulating foil 12. The optoelectronic semiconductor chip 2 then electrically conductively connects to the second metal foil 13 by a contact wire 21. An optoelectronic component described here, for example, a light-emitting diode, is realized in this way.

The light-emitting diode chip 2 can be a thin-film chip, for example, in which a growth substrate is removed from epitaxially grown layers of the chip.

FIG. 1D shows a schematic side view of the optoelectronic component from which it is evident that the optoelectronic component is distinguished by its small thickness, inter alia.

Figure 2A:
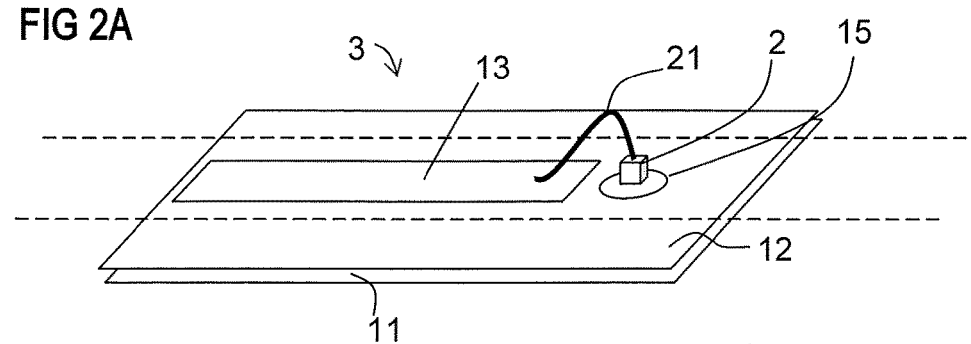
Figure 2B:
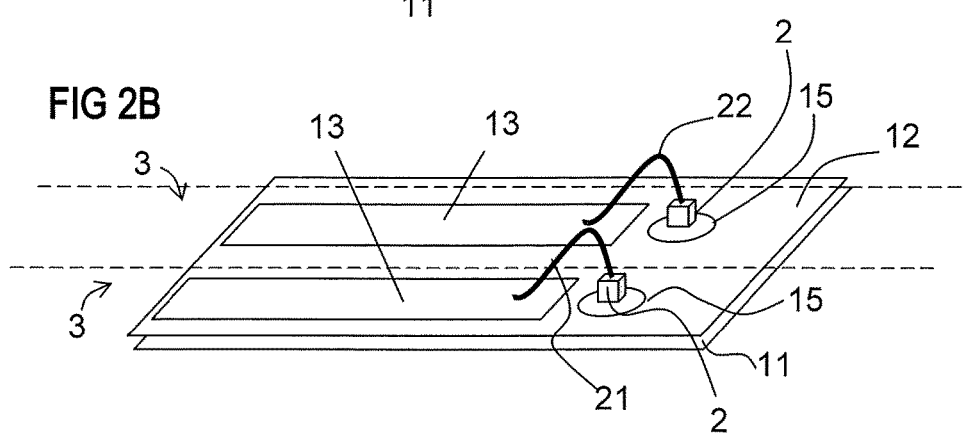
Figure 2C:
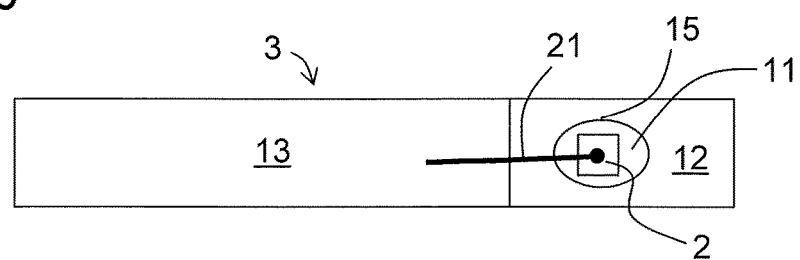

Optoelectronic components described here are described on the basis of schematic illustrations in conjunction with FIGS. 2A to 2C. As is evident from the figures, individual optoelectronic components 3 can be cut to size with regard to their external dimensions, for example, along the dashed lines shown. This can be done by cutting through the layer stack of the foils.

FIG. 2B shows that an optoelectronic component described here can comprise more than only one optoelectronic semiconductor chip 2, it being possible to divide the optoelectronic component such that optoelectronic components 3 each carrying only one optoelectronic semiconductor chip in turn arise. Strip-shaped optoelectronic components can be produced in this way as seen in FIG. 2C.

Figure 3A:
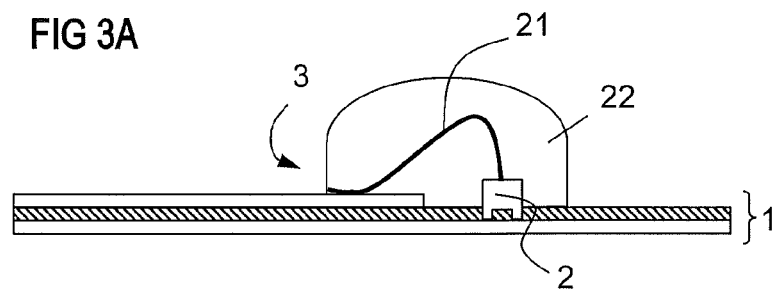
Figure 3B:
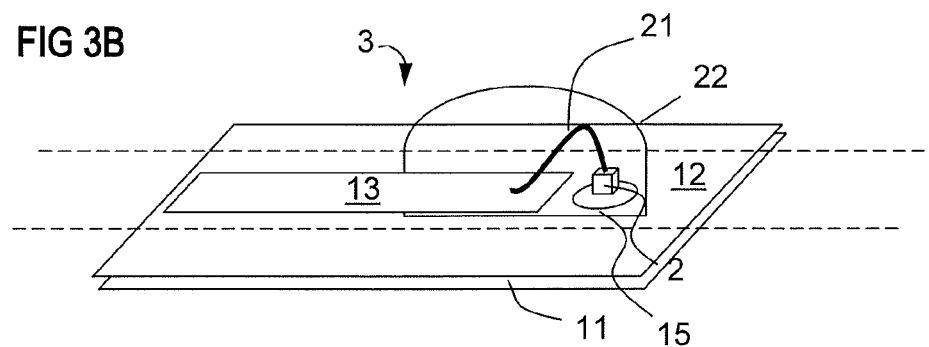
Figure 3C:
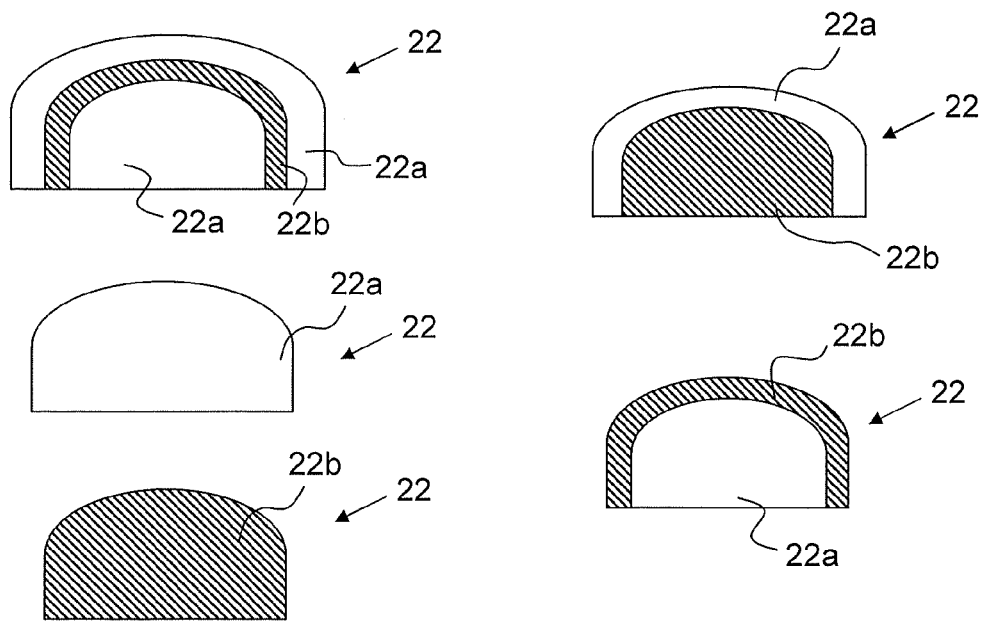

In conjunction with FIGS. 3A to 3C, a description is given of optoelectronic components in which the semiconductor chip 2 is surrounded by a potting body 22. The potting body 22 is formed with a matrix material, for example, which can be the same material as the material of the first electrically insulating foil 12. A particularly good adhesion between the potting body 22 and the circuit board 1 can be achieved in this way. The potting body 22 covers the semiconductor chip 2 and the recess 15 and in this case is in direct contact with the first metal foil 11, the second metal foil 13 and the first electrically insulating foil 12.

The potting body 22 can be curved in a lens-shaped fashion at its top side facing away from the circuit board 1 thereby increasing a coupling-out of electromagnetic radiation generated in the semiconductor chip 2 during operation, for example. Furthermore, the potting body 22 constitutes a mechanical protection for the contact wire 21 and the semiconductor chip 2. The contact wire 21 can be arranged completely in the potting body 22.

Various configurations for the potting body 22 are described in conjunction with FIG. 3. In this case, the potting body 22 can have unfilled, optically transparent regions 22a and filled regions 22b. The filled regions 22b can be filled with a luminous conversion material, for example. The optoelectronic component can emit white light during operation, for example.

If the potting body 22 has, for example, an unfilled region 22a surrounded by a filled region 22b, a particularly homogenous color of the mixed radiation emitted by the optoelectronic component arises over the emission angle.

If an unfilled region 22a curved in a lens-shaped fashion is introduced above the filled region 22b, then a homogenous color arises over the emission angle in conjunction with particularly high efficiency.

Further examples of a circuit board described here are explained in greater detail on the basis of schematic illustrations in conjunction with FIGS. 4 and 5. In this example, the circuit board comprises a second electrically insulating layer 14 arranged at the underside of the first metal foil 11, the underside facing away from the first electrically insulating layer 12. The second electrically insulating foil 14 can be, for example, an adhesive foil comprising an adhesive layer 17 at its underside. The adhesive foil can be provided to adhesively bond the circuit board on a heat sink. Furthermore, the adhesive foil can form an electrical insulation with respect to the heat sink.

The second electrically insulating foil 14 can comprise one perforation 18 (cf. FIG. 4) or a plurality of perforations 18 (cf. FIG. 5) along which the second electrically insulating foil 14 can be removed in places. Where the second electrically insulating foil 14 is removed, the first metal foil 11 is exposed and electrical contact can be made therewith, for example.

An arrangement of optoelectronic components 3 described here is explained in greater detail in conjunction with FIG. 6A. In this case, the arrangement is a planar light source. That is to say that the semiconductor chips 2 are light-emitting diode chips that emit light, for example, in this case. The arrangement comprises a multiplicity of optoelectronic components 3 which overlap one another in a connection region 31 such that two metal foils 13 are in electrical and, if appropriate, direct contact with directly overlying first metal foils 11 of an adjacent optoelectronic component 3.

The optoelectronic components shaped in an elongate fashion are arranged in a star-shaped fashion in this case, wherein the semiconductor chips 2 are arranged along a closed line, a circle K in this case.

FIG. 6B shows, in contrast to FIG. 6A, an arrangement in which smaller and larger optoelectronic components are combined with one another such that the semiconductor chips are arranged along two concentric circles or along a spiral S. In this way, the emission area of the arrangement can be filled with a particularly large number of optoelectronic semiconductor chips.

The electrical interconnection of an arrangement such as is shown in FIGS. 6A and 6B is explained in greater detail in conjunction with FIG. 7. The individual circuit boards 1 of the optoelectronic components 3 electrically and mechanically connect to one another in the connection region 31. A series connection between the individual optoelectronic components is realized in this way. In this case, it is possible for the optoelectronic components 3 to have at their upper surface facing away from the first metal foil 11, on the second metal foil 13, a further, third electrically insulating foil which is removed only in the region of the connection region 31, and in the region of the contact wire 21.

Our circuit boards, components and arrangements are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic component comprising:
   an optoelectronic semiconductor chip; and
   a circuit board comprising:
      an electrically conductive first metal foil;
      a first electrically insulating foil; and
      an electrically conductive second metal foil;
   wherein
      the first electrically insulating foil is applied to the first metal foil at a top side of the first metal foil and mechanically connects thereto;
      the first electrically insulating foil has a recess in which the first metal foil is exposed;
      the optoelectronic semiconductor chip is located inside the recess;
      the recess electrically conductively fixes the optoelectronic semiconductor chip to the first metal foil within the recess;
      the second metal foil is applied at a top side of the first electrically insulating foil, said top side facing away from the first metal foil, and mechanically connects to said electrically insulating foil;
      the first electrically insulating foil is free of the second metal foil at least in the region of the recess;
      the second metal foil electrically contacts the optoelectronic semiconductor chip,
      the first and second metal foils have a thickness of at least 20 µm to at most 400 µm, and
      the optoelectronic semiconductor chip has a height larger than a combined thickness of the second metal foil and the first electrically insulating foil so that the optoelectronic semiconductor chip protrudes from the recess and above the second metal foil.

2. The component according to claim 1, wherein the first and second metal foils connect to the electrically insulating foil by an adhesive.

3. The component according to claim 1, wherein the first electrically insulating foil, apart from the recess, completely covers the first metal foil at its top side, and the recess completely surrounds material of the first electrically insulating foil in lateral directions.

4. The component according to claim 1, wherein the first and second metal foils are formed by aluminum foil.

5. The component according to claim 1, further comprising a second electrically insulating foil applied to the first metal foil at an underside of the first metal foil, said underside facing away from the first electrically insulating foil and mechanically connects to said first metal foil.

6. The component according to claim 5, wherein the second electrically insulating foil has an adhesive layer at its underside facing away from the first metal foil.

7. The optoelectronic component according to claim 1, wherein the optoelectronic semiconductor chip electrically conductively connects to the second metal foil by a contact element comprising a contact wire fixed to the optoelectronic semiconductor chip and the second metal foil.

8. The optoelectronic component according to claim 1, wherein the optoelectronic semiconductor chip is surrounded by a potting body and the potting body directly contacts the first metal foil and the first electrically insulating foil.

9. An arrangement of optoelectronic components comprising:
   at least two optoelectronic components according to claim 1, wherein
   a second of the optoelectronic components is arranged on a first of the optoelectronic components such that the first metal foil of the second optoelectronic component covers the second metal foil of the first optoelectronic component in places and the two metal foils electrically conductively and mechanically connect to one another, and the first and second optoelectronic components electrically connect in series.

10. The arrangement according to claim 9, wherein three or more of the optoelectronic components are arranged one above another, and the optoelectronic components electrically connect in series via an electrically conductive and mechanical connection of the first metal foil of one of the optoelectronic components to the second metal foil of the directly underlying optoelectronic component.

11. The arrangement according to claim 9, wherein all optoelectronic components overlap one another within a connection region and the optoelectronic semiconductor chips of the optoelectronic components do not overlap.

12. The arrangement according to claim 9, wherein the optoelectronic semiconductor chips are arranged along at least one imaginary line which is an imaginary circle or an imaginary spiral.

13. The component according to claim 1, wherein the electrically conductive first metal foil is a thin sheet, and lateral dimensions in directions parallel to a main extension plane of said sheet are greater than the thickness of the sheet in a vertical dimension running orthogonal to the main extension plane of the sheet.

14. The component according to claim 1, wherein the first electrical insulating foil is a thin sheet, and lateral dimensions in directions parallel to a main extension plane of said sheet are greater than the thickness of the sheet in a vertical dimension running orthogonal to the main extension plane of the sheet.

15. The component according to claim 1, wherein the second metal foil is a thin sheet and lateral dimensions in directions parallel to a main extension plane of said sheet are greater than the thickness of the sheet in a vertical dimension running orthogonal to the main extension plane of the sheet.

16. An arrangement of optoelectronic components comprising:
   at least two optoelectronic components according to claim 1,
   wherein
   a second of the optoelectronic components is arranged on a first of the optoelectronic components such that the first metal foil of the second optoelectronic component covers the second metal foil of the first optoelectronic component in places and the two metal foils electrically conductively and mechanically to one another, the first and second optoelectronic components electrically connect in series, and the optoelectronic components are arranged along at least one imaginary line which is an imaginary circle or an imaginary spiral.

17. The arrangement according to claim 9, wherein each circuit board is rectangularly shaped and the recesses with the optoelectronic semiconductor chips are each arranged in an edge region of the circuit boards, all optoelectronic components overlap one another within a connection region, the optoelectronic semiconductor chips of the optoelectronic components do not overlap, and the optoelectronic components are arranged in a fan-shape or star-shape.

18. An optoelectronic component comprising:

an optoelectronic semiconductor chip; and a circuit board comprising:
 an electrically conductive first metal foil;
 a first electrically insulating foil; and
 an electrically conductive second metal foil;
 wherein
  the first electrically insulating foil is applied to the first metal foil at a top side of the first metal foil and mechanically connects thereto;
  the first electrically insulating foil has a recess in which the first metal foil is exposed;
  the optoelectronic semiconductor chip is located inside the recess;
  the recess electrically conductively fixes the optoelectronic semiconductor chip to the first metal foil within the recess;
  the second metal foil is applied at a top side of the first electrically insulating foil, said top side facing away from the first metal foil, and mechanically connects to said electrically insulating foil;
  the first electrically insulating foil is free of the second metal foil at least in the region of the recess;
  the optoelectronic semiconductor chip electrically conductively connects to the second metal foil by a contact element comprising a contact wire fixed to the opelectronic semiconductor chip and the second metal foil;
  a combined height of the optoelectronic semiconductor chip and the contact wire is larger than a combined thickness of the second metal foil and the first electrically insulating foil so that the contact wire protrudes from the recess and above the second metal foil;
  the optoelectronic semiconductor chip and the contact wire are surrounded by a potting body and the potting body directly contacts the first metal foil and the first electrically insulating foil;
  the potting body completely covers the recess;
  the potting body mechanically protects the optoelectronic semiconductor chip and the contact wire; and
  the potting body protrudes from the recess and above the second metal foil.

19. An optoelectronic component comprising: an optoelectronic semiconductor chip; and a circuit board comprising: an electrically conductive first metal foil; a first electrically insulating foil; and an electrically conductive second metal foil; wherein the first electrically insulating foil is applied to the first metal foil at a top side of the first metal foil and mechanically connects thereto; the first electrically insulating foil has a recess in which the first metal foil is exposed; the optoelectronic semiconductor chip is located inside the recess; the recess electrically conductively fixes the optoelectronic semiconductor chip to the first metal foil within the recess; the second metal foil is applied at a top side of the first electrically insulating foil, said top side facing away from the first metal foil, and mechanically connects to said electrically insulating foil; the first electrically insulating foil is free of the second metal foil at least in the region of the recess; the first and second metal foils have a thickness of at least 20 pm to at mast 400 pm; the optoelectronic semiconductor chip electrically conductively connects to the second metal foil by a contact element comprising a contact wire fixed to the optoelectronic semiconductor chip and the second metal foil; and a combined height of the optoelectronic semiconductor chip and the contact wire is larger than a combined thickness of the second metal foil and the first electrically insulating foil so that the contact wire protrudes from the recess and above the second metal foil.

* * * * *

UNITED STATES PATENT AND TRADEMARK OFFICE
CERTIFICATE OF CORRECTION

PATENT NO. : 9,763,330 B2  
APPLICATION NO. : 14/165996  
DATED : September 12, 2017  
INVENTOR(S) : Behringer et al.

Page 1 of 1

It is certified that error appears in the above-identified patent and that said Letters Patent is hereby corrected as shown below:

In the Claims

At Column 12, at Line 36, please change "20 pm to at mast 400 pm" to -- 20 µm to at most 400 µm --.

Signed and Sealed this  
Twelfth Day of December, 2017

Joseph Matal  
*Performing the Functions and Duties of the*  
*Under Secretary of Commerce for Intellectual Property and*  
*Director of the United States Patent and Trademark Office*